United States Patent
Moon

(10) Patent No.: US 9,826,648 B2
(45) Date of Patent: Nov. 21, 2017

(54) DISPLAY DEVICE EQUIPPED WITH FRAME ASSEMBLY

(71) Applicant: JSLCD CO., LTD., Seoul (KR)

(72) Inventor: Jong Sub Moon, Seoul (KR)

(73) Assignee: JSLCD CO., LTD., Seoul (KR)

( * ) Notice: Subject to any disclaimer, the term of this patent is extended or adjusted under 35 U.S.C. 154(b) by 0 days.

(21) Appl. No.: 15/377,134

(22) Filed: Dec. 13, 2016

(65) Prior Publication Data

US 2017/0238430 A1    Aug. 17, 2017

(30) Foreign Application Priority Data

Feb. 16, 2016    (KR) .......................... 10-2016-0017873

(51) Int. Cl.
| | |
|---|---|
| *H05K 5/00* | (2006.01) |
| *G09F 9/00* | (2006.01) |
| *H05K 5/02* | (2006.01) |
| *G09F 9/30* | (2006.01) |
| *G09F 19/22* | (2006.01) |

(52) U.S. Cl.
CPC ............ *H05K 5/0017* (2013.01); *G09F 9/00* (2013.01); *H05K 5/0004* (2013.01); *H05K 5/0204* (2013.01); *G09F 9/30* (2013.01); *G09F 19/22* (2013.01)

(58) Field of Classification Search
CPC .. H05K 5/0017; H05K 5/0004; H05K 5/0204; G09F 9/00; G09F 9/30; G09F 19/22; H04N 5/64; H04N 5/655
USPC .................................................. 361/679.21
See application file for complete search history.

(56) References Cited

U.S. PATENT DOCUMENTS

| | | | | |
|---|---|---|---|---|
| 6,886,701 | B2 * | 5/2005 | Hong ..................... | F16M 11/10 211/104 |
| 7,334,765 | B2 * | 2/2008 | Hwang ................... | A47G 1/24 248/284.1 |
| 7,690,611 | B2 * | 4/2010 | Asamarai ............... | F16M 11/10 248/225.11 |
| 8,109,580 | B1 * | 2/2012 | Didier .................... | G09F 19/22 312/245 |

(Continued)

FOREIGN PATENT DOCUMENTS

| | | |
|---|---|---|
| KR | 1020040068634 | 8/2004 |
| KR | 1020050096405 | 10/2005 |

(Continued)

*Primary Examiner* — Adrian S Wilson
*Assistant Examiner* — Abhishek Rathod
(74) *Attorney, Agent, or Firm* — Cantor Colburn LLP

(57) ABSTRACT

Provided is a display device equipped with a frame assembly that can prevent malfunction or failure of a control substrate attributable to internal heating and which has a simplified structure enabling easy production of a compact display device. The frame assembly includes: a first frame combined with a display panel; a second frame spaced from and combined with a rear surface of the first frame; and a third frame and a fourth frame that are combined with a rear surface of the second frame in a state in which the display panel is mounted. The first and second frames have respective openings, the third frame has a width larger than that of the fourth frame in a front-and-rear direction, and an upper portion of the display panel is inclined forward when the display device is installed such that the control substrate is vertically arranged.

6 Claims, 6 Drawing Sheets

(56) References Cited

U.S. PATENT DOCUMENTS

| | | | | |
|---|---|---|---|---|
| 8,726,897 | B2 * | 5/2014 | Wallgren | F24J 2/4638 |
| | | | | 126/571 |
| 9,709,295 | B2 * | 7/2017 | Adamik | F24F 11/0086 |
| 2002/0033436 | A1 * | 3/2002 | Peng | F16M 11/10 |
| | | | | 248/284.1 |
| 2002/0163776 | A1 * | 11/2002 | Thompson | G06F 1/1601 |
| | | | | 361/679.21 |
| 2004/0251387 | A1 * | 12/2004 | Kim | F16M 11/041 |
| | | | | 248/201 |
| 2005/0204596 | A1 * | 9/2005 | Peng | G09F 21/04 |
| | | | | 40/320 |
| 2011/0141671 | A1 * | 6/2011 | Ishizu | F16M 11/10 |
| | | | | 361/679.01 |
| 2013/0010413 | A1 * | 1/2013 | Kim | G09F 9/33 |
| | | | | 361/679.01 |
| 2014/0262481 | A1 * | 9/2014 | Khoury | H05K 1/111 |
| | | | | 174/480 |
| 2014/0307171 | A1 * | 10/2014 | Fujikawa | H04N 5/64 |
| | | | | 348/725 |
| 2015/0208017 | A1 * | 7/2015 | Mori | H04N 5/655 |
| | | | | 348/794 |
| 2015/0208523 | A1 * | 7/2015 | Lee | H05K 5/02 |
| | | | | 361/679.01 |
| 2017/0196108 | A1 * | 7/2017 | Inobe | H05K 5/03 |

FOREIGN PATENT DOCUMENTS

| | | |
|---|---|---|
| KR | 200436241 | 7/2007 |
| KR | 100751898 | 8/2007 |
| KR | 200448857 | 5/2010 |
| KR | 1020120001674 | 1/2012 |
| KR | 101424686 | 8/2014 |

\* cited by examiner

DISPLAY DEVICE EQUIPPED WITH FRAME ASSEMBLY

BACKGROUND OF THE INVENTION

1. Field of the Invention

The present invention relates to a display device equipped with a frame assembly. More particularly, the present invention relates to a display device equipped with a frame assembly that enables a compact display device, can prevent malfunction or failure of a control substrate attributable to internal heating, and has a simplified structure enabling easy production of a display device, the frame assembly including: a first frame with which a display panel is combined; a second frame spaced from and combined with a rear surface of the first frame; and a third frame and a fourth frame that are combined with a rear surface of the second frame in a state in which the display panel is mounted, wherein the first and second frames have respective openings, the third frame has a width larger than that of the fourth frame in a front-and-rear direction, and an upper portion of the display panel is inclined forward when the display device is installed with the control substrate being vertical.

2. Description of the Related Art

Conventional signs or billboards are typically structured such that images or text (including business names, telephone numbers, or other advertisement content) is printed on the surface of a light-transmissive front panel, the front panel with the printing thereon is encased within a housing, and a light source such as a fluorescent lamp or an LCD lamp is installed in the housing.

However, conventional signs or billboards have a problem that images or text has to be newly printed when it is necessary to correct or partially edit the printing on the signs or billboards. That is, for partial correction of advertisement content, a sign or billboard has to be newly created.

In order to solve this problem, electronic visual displays that present text, symbols, diagrams, images using light-emitting diodes (LEDs) are being widely used due to easy production and convenient use of signs as well as a high advertising impact.

As to a conventional method of presenting a specific pattern with an electronic visual display that includes LED lamps, when a plurality of LED lamps is installed on a panel, electrodes are connected to each other via a wire so that the LED lamps can be powered to flash, whereby the LED lamps arranged in a specific pattern can present desired images or text.

However, such a conventional LED lamp-based electronic visual display has a problem that information that can be presented by such a display is limited. That is, the display cannot present high-definition images or video clips.

For this reason, LCD or LED display devices (so-called monitors) that are currently widely used are preferred to be used for signs or billboards. In the case of using LCD or LED display devices instead of signs or billboards, information or advertisements to be presented by the LCD or LED display devices are created in the form of video clips first and the video clips are displayed by the LCD or LED display devices through control of electronic elements of the LCD or LED display devices.

Most display devices are typically assembled using the frame structure of conventional monitors for indoor use. Therefore, conventional display devices are not sufficiently durable and suffer from heating of the frame structure.

For example, Korean Utility Model No. 20-0436241 (Jul. 3, 2007), titled "Buried Frame Assembly for an Advertising Display Panel", discloses a technology in which a buried frame assembly includes a display panel, a rear frame fitted into a recess in a wall and provided with a first cavity, a middle frame received in the first cavity and provided with a second cavity in which the display panel is received, a front cover that is fixed to the middle frame to support the front surface of the display panel and is provided with a transparent window, and a coupling member received inside the first cavity and on the bottom surface of the second cavity.

The conventional technology is problematic such that since the display panel is simply fitted into the rear frame and the middle frame, there is nearly no space or gap between the frames and the control substrate when a control substrate for controlling the display panel is installed in the frames. Therefore, the conventional technology has poor heat dissipation efficiency.

In addition, the conventional technology relates to a display device mounted in or fixed to a wall in a place where nearly no vibrations occur. Therefore, when the conventional frame assembly is applied to display devices installed and used in transport vehicles such as buses and subway trains, since the frames are not strongly combined with each other, vibrations or impacts that occur during driving of the transport vehicles are directly applied to the display devices, which is likely to cause breaking or failure of display panels or control substrates in the display devices.

In order to solve this problem, there is proposed a method in which a housing is added to the above-described conventional frame structure. However, this solution is also problematic in that it is difficult to produce a compact display device due to a reinforcing structure added thereto for improvement of durability, and a manufacturing method and assembled structure of display devices are complicated.

There are also other conventional technologies related to a frame structure for a display device. Examples thereof include Korean Patent No. 10-1424686, Korean Patent No. 10-0751898, Korean Patent Application Publication No. 10-2012-0001674, and Korean Utility Model No. 20-0448857.

SUMMARY OF THE INVENTION

Accordingly, the present invention has been made keeping in mind the above problems occurring in the prior art, and an object of the present invention is to provide a display device equipped with a frame assembly in which a first to fifth frame are securely assembled to form a module to prevent disassembling, breaking, or failure of an assembled structure of frames, a display panel, or a control substrate when the display device is installed in a place such as a bus or a subway train in which the display device is under continuous vibration or impact.

Specifically, an object of the present invention is to provide a display device having a structure that provides a gap between a frame to which a display panel is mounted and a frame to which a control substrate is mounted, to prevent malfunction or malfunctioning of the control substrate attributable to heating of the frames and to enable a compact display device, wherein in the structure, a second frame to which the control substrate is mounted is combined with a first frame such that the first frame and the second frame are spaced from each other by a support portion and a base portion of the first frame, and a third frame has a width larger than that of a fourth frame so that an upper end portion of the display panel can be inclined forward when the display device is installed with the display panel being vertical.

Another object of the present invention is to provide a display device including a coupling unit combined with a fifth frame, the coupling unit alleviating vibrations or impacts transferred to a display panel or a control substrate, securely fixing the display device to an upper fixed structure installed in a display device installation place so that the display device may not be easily detached from the upper fixed structure by vibrations or impacts, and enabling the display device to be easily detached from the upper fixed structure when a user wants to detach the display device from the upper fixed structure, wherein the coupling unit includes: a coupling member having a plurality of hooked portions thereon; and a bracket combined with the upper fixed structure in the display device installation place and provided with a plurality of engagement holes through the hooked portions are inserted to be engaged with the bracket.

A further object of the present invention is to provide a display device of which a display panel is naturally inclined when the display device is coupled to an upper fixed structure in a display device installation place, so that a user can conveniently and comfortably see the display panel. To accomplish this object of the invention, a second fourth-frame connection portion of a fourth frame is bent by a predetermined angle corresponding to a length of a second third-frame connection portion of a third frame in a front-and-rear direction. Thus, all of the frames are combined with a second frame and a control panel in a surface contact manner.

In order to accomplish the objects of the present invention, according to one aspect, there is provided a display device including a display panel and a frame assembly, the frame assembly including: a first frame including a body provided with a first through-hole opening in a center portion thereof and a front surface with which the display panel is combined; support portions bent and extending rearward from respective sides of the body, and base portions bent and extending inward from lower ends of the support portions; a second frame combined with a rear surface of the base portion of the first frame and provided with a second through-hole opening in a center portion thereof; a third frame that is combined with an upper portion of a rear surface of the second frame, the upper portion being above the second through-hole opening, and with which an upper end portion of a control substrate connected to the display panel is combined; and a fourth frame that is combined with a lower portion of the rear surface of the second frame, the lower portion being under the second through-hole opening, and with which a lower end portion of the control substrate is combined, wherein the third frame has a width larger than that of the fourth frame in a front and rear direction, so that an upper end portion of the display panel is inclined forward when the display device is installed such that the control substrate is vertically arranged.

In the display device, the frame assembly may further include a fifth frame that is combined with an upper portion of the rear surface of the second frame, the upper portion being above the second through-hole opening, and with which a coupling unit for coupling the display device to an upper fixed structure installed in a display device installation place is combined.

In the display device, the coupling unit may include: a coupling member combined with an upper surface of the fifth frame and provided with a plurality of hooked portions protruding from an upper surface of a wall portion thereof; and a bracket fixed to the upper fixed structure in the display device installation place and provided with a plurality of engagement holes through which the hooked portions are inserted to be engaged with the bracket.

In the display device, the third frame may include a first third-frame connection portion that is in surface contact with the rear surface of the second frame and combined with an upper portion of the rear surface of the second frame, a second third-frame connection portion bent rearward from a lower end of the first third-frame connection portion and extending rearward by a predetermined width, and a third third-frame connection portion that is bent downward from a rear end of the second third-frame connection portion and is in surface contact with an upper end portion of a rear surface of the control substrate.

In addition, the fourth frame may include a first fourth-frame connection portion that is in surface contact with the rear surface of the second frame and combined with a lower portion of the rear surface of the second frame (the lower portion being under the second through-hole opening), and a second third-frame connection portion that is in surface contact with a lower end portion of the rear surface of the control substrate and is bent rearward from upper ends of respective sides of the first fourth-frame connection portion at a predetermined angle corresponding to a width of the second third-frame connection portion in the front-and-rear direction.

In the display device according to the present invention, the second frame is provided between the first frame combined with the display panel and the third and fourth frames combined with the control substrate. Therefore, the display panel and the control substrate are combined with a gap therebetween. For this reason, the control substrate is rarely affected by heat generated by the display panel. Furthermore, since air can circulate through the openings of the first and second frames, heat can be dissipated. In addition, since the width of the third frame combined with the upper end portion of the control substrate is wider than that of the fourth frame combined with the lower end portion of the control substrate in terms of the front and rear direction, the upper portion of the control substrate is inclined rearward. Therefore, when the display device is installed with the control substrate being vertically, an upper portion of the display panel is inclined forward. For this reason, the side of the display device can be reduced.

The display device according to the present invention has the following advantages: vibrations or impacts occurring in an installation place where the display device is installed are minimally transferred to the display panel or the control substrate due to a gap between the frames in an assembled structure; and the display device can be easily coupled to and decoupled from an upper fixed structure in the installation place because the coupling member and the bracket are simply and strongly engaged with each other by the hooked portions of the coupling member and the engagement holes of the bracket.

In addition, the display device according to the present invention has an advantage of maintaining secure coupling between the hooked portions of the coupling member and the engagement holes of the bracket by using a pressing member. In addition, due to the pressing member, coupling and decoupling of the display device to and from the upper fixed structure in the installation place can be conveniently performed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
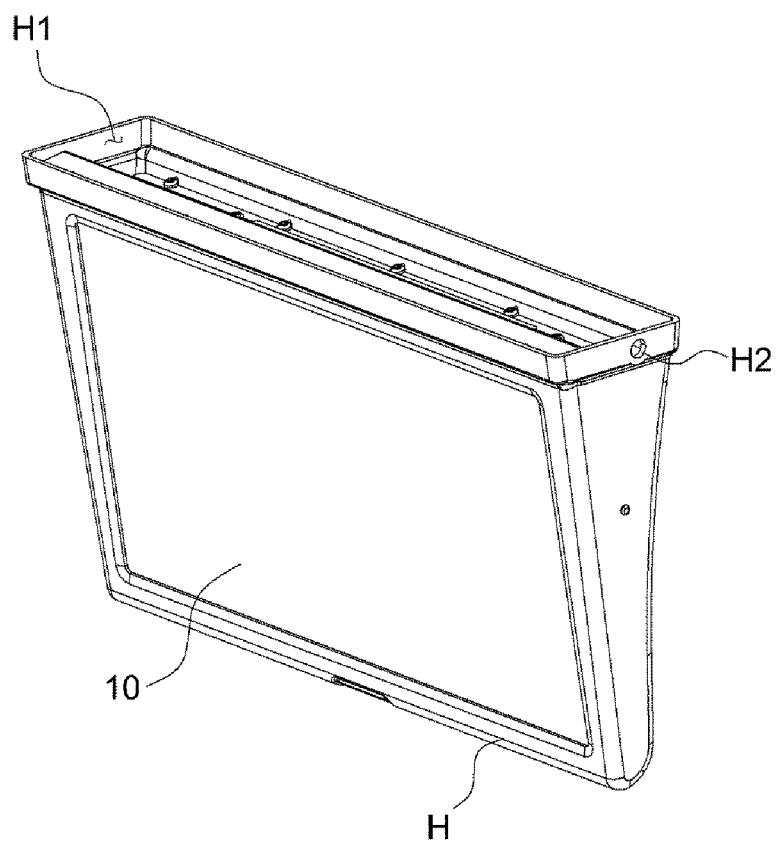
FIG. 1 is a perspective view illustrating the appearance of a display device according to one embodiment of the present invention.

The present invention will now be described in detail based on aspects (or embodiments). The present invention may, however, be embodied in many different forms and should not be construed as being limited to only the embodiments set forth herein, but should be construed as covering modifications, equivalents or alternatives falling within ideas and technical scopes of the present invention.

In the figures, like reference numerals, particularly, reference numerals having the same last two digits or the same last two digits and letters refer to like elements having like functions throughout, and unless the context clearly indicates otherwise, elements referred to by reference numerals of the drawings should be understood based on this standard.

Also, for convenience of understanding of the elements, in the figures, sizes or thicknesses may be exaggerated to be large (or thick), may be expressed to be small (or thin) or may be simplified for clarity of illustration, but due to this, the protective scope of the present invention should not be interpreted narrowly.

The terminology used herein is for the purpose of describing particular aspects (or embodiments) only and is not intended to be limiting of the present invention. As used herein, the singular forms are intended to include the plural forms as well, unless the context clearly indicates otherwise.

It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Terms such as 'a first ~' and 'a second ~' are used only for the purpose for distinguishing a constitutive element from other constitutive element, but a constitutive element should not be limited to a manufacturing order, and the terms described in the detailed description of the invention may not be consistent with those described in the claims.

Figure 2:
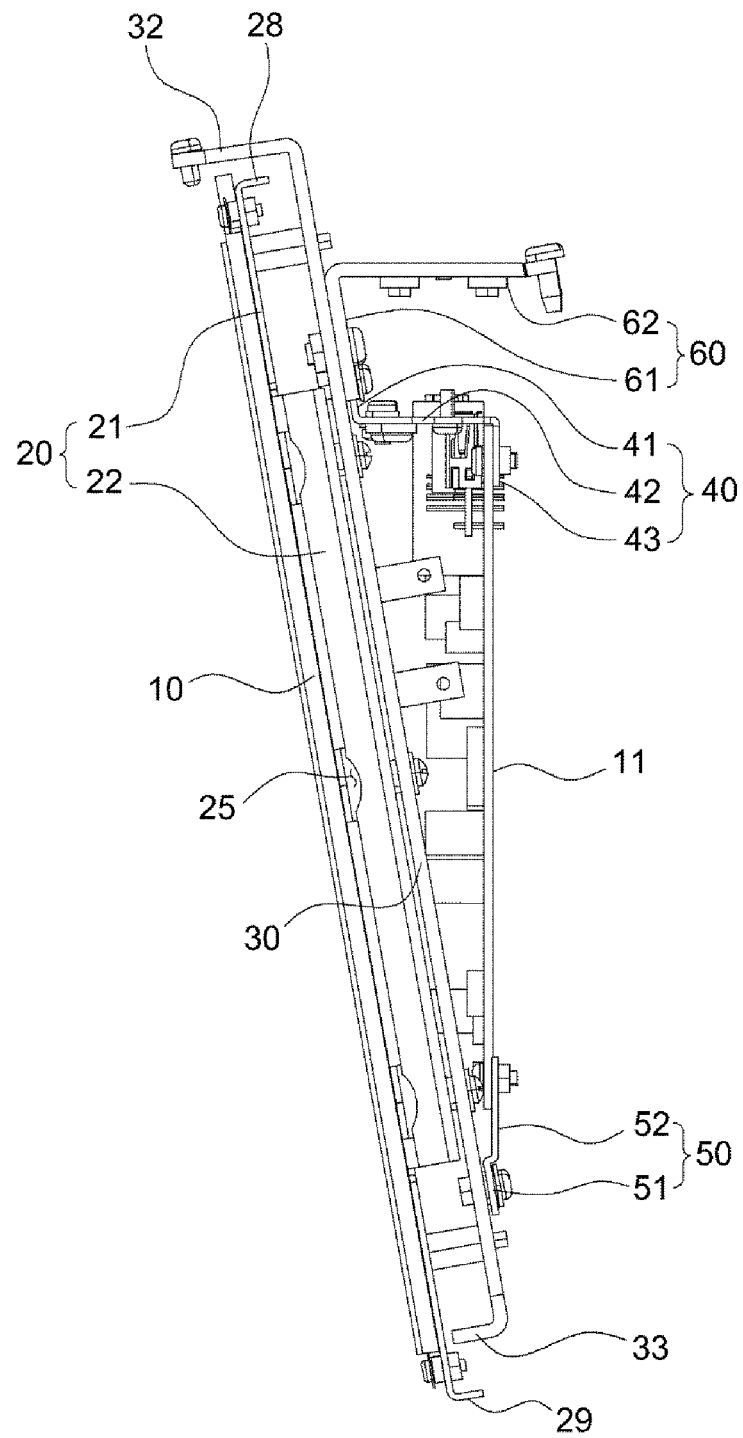
FIG. 2 is a side view of the display device according to one embodiment of the present invention.

For convenience of description of a display device according to preferred embodiments of the present invention, when an approximate direction rather than a precise direction is specified with reference to FIGS. 1 and 2, a front side and a rear side are determined such that the front side of the display device is a side to which a display panel 10 is provided, a lower side is determined based on a direction to which gravity is applied, and up and down directions and right and left directions are determined based on the lower side. This standard may be also applied to the other drawings, and directions may be specified and described based on this standard unless the detailed description of the invention and the claims specially indicate otherwise.

Hereinbelow, a display device according to one embodiment of the present invention will be described with reference to the accompanying drawings.

Figure 3:
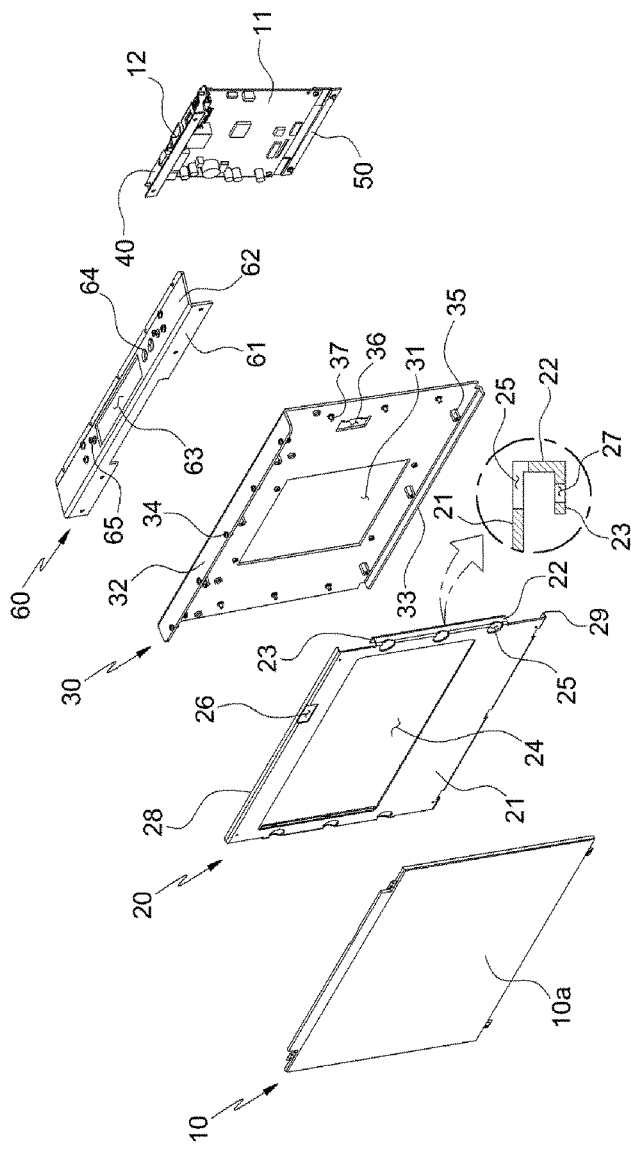
FIGS. 3 and 4 are exploded perspective views illustrating the display device according to one embodiment of the present invention.
Figure 4:
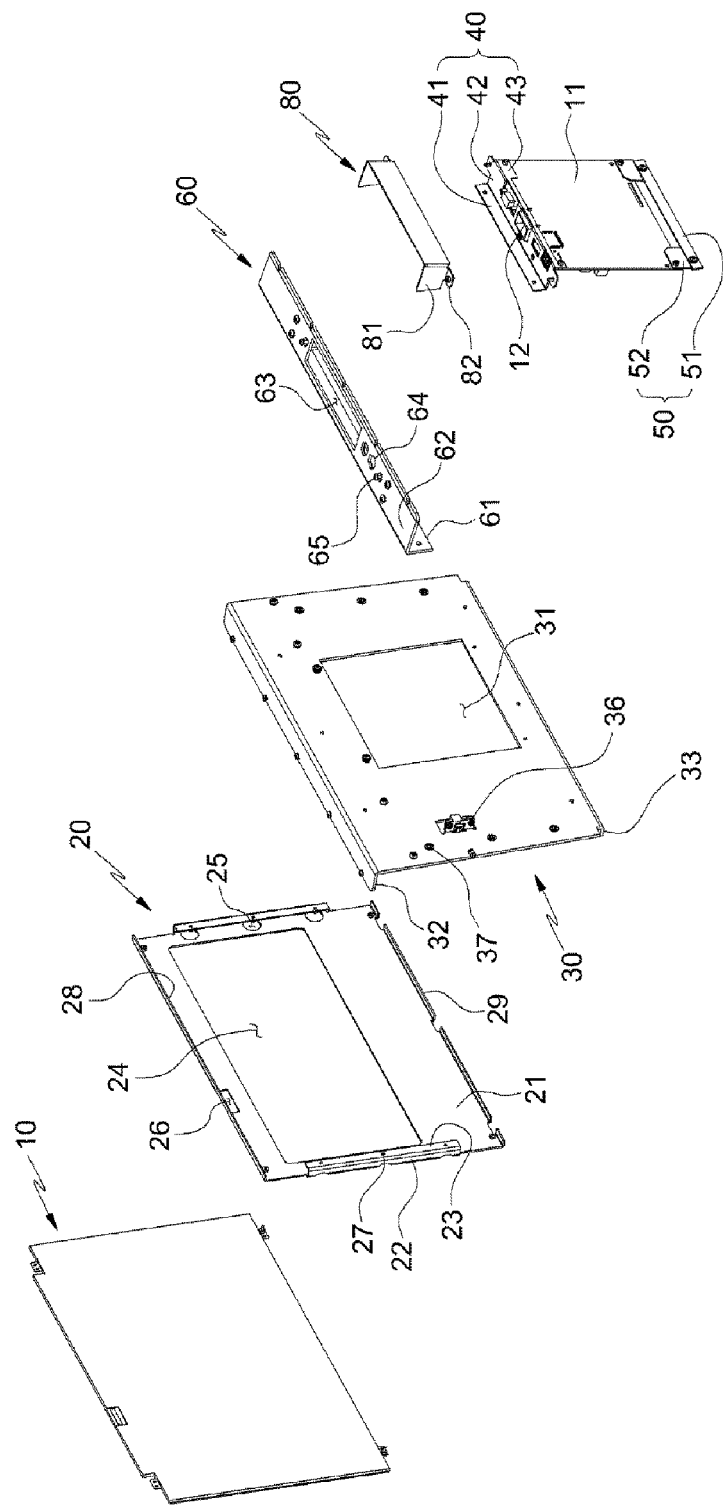
Figure 5:
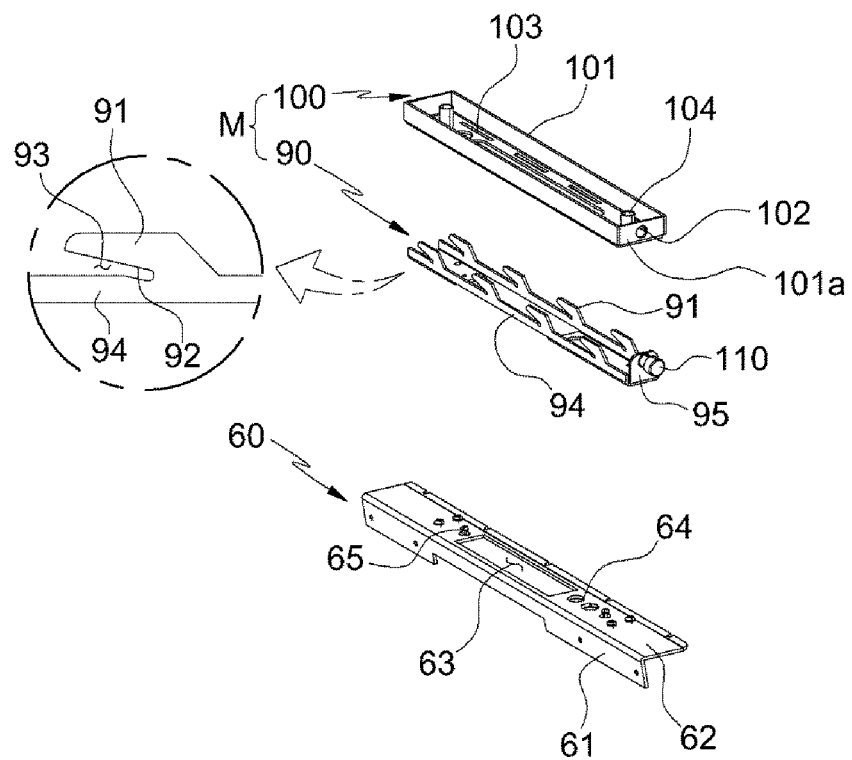
FIG. 5 is an exploded perspective view illustrating a coupling unit in the display device according to one embodiment of the present invention.
Figure 6:
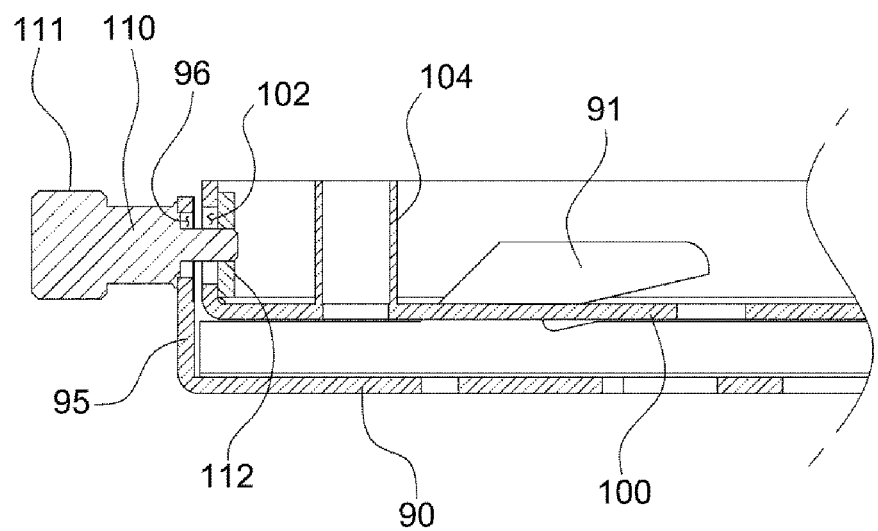
FIGS. 6 and 7 are cross-sectional views illustrating a main part of the coupling unit in the display device according to one embodiment of the present invention.
Figure 7:
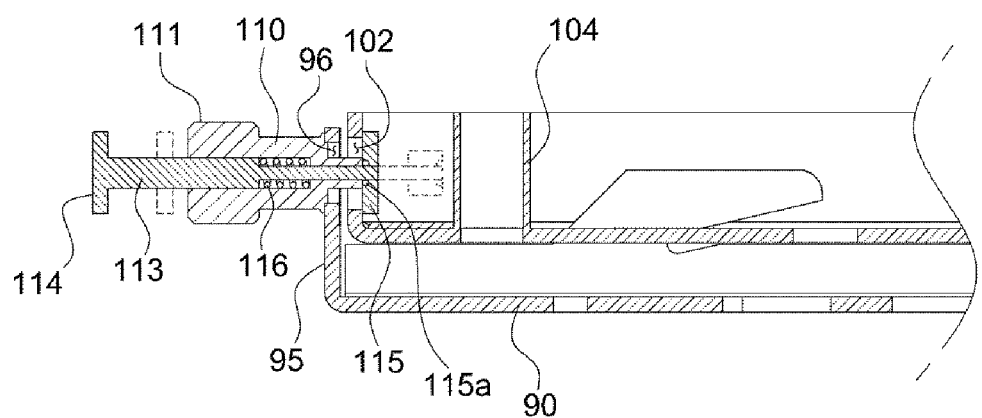

FIG. 1 is a perspective view illustrating the appearance of a display device according one embodiment of the present invention, FIG. 2 is a side view of the display device from which a housing is removed, FIGS. 3 and 4 are exploded perspective views illustrating an internal structure of the display device according to one embodiment of the present invention, and FIGS. 5, 6, and 7 are a perspective view and cross-sectional views illustrating a main part of a coupling unit of the display device according to one embodiment of the present invention. With reference to FIGS. 1 through 7, a display device according to one embodiment of the present invention generally includes a display panel 10, a frame assembly, and a coupling unit.

The display panel 10 presents various kinds of information or advertisements provided in the form of video clips sent from a main device or through a network. The display panel 10 includes a control substrate 11 that is combined with a first frame accommodated in a housing H and controls display of images.

The display panel 10 and the control substrate 11 are connected to each other via a cable (not shown) that is generally used for connection of various kinds of electronic devices. The control substrate 11 is connected to a storage medium (for example, hard disk) or a network and causes the display panel 10 to display various kinds of images or video clips sent from the storage medium or through the network.

The display panel 10 may be a display panel using liquid crystals (LCs) or light-emitting diodes (LEDs). The control substrate 11 may be a printed circuit board (PCB) on which various kinds of devices or chips for control of image output are mounted.

An upper portion of the control substrate 11 is provided with a terminal block 12 for connection to connectors of various kinds of cables. The terminal block 12 may include: a LAN port for connection to a network (for example, Internet); USB ports for connection to a keyboard, a mouse, a USB memory device, and so on; an HDMI port for transmission and reception of image signals; data input and output ports for input and output of data, and various kinds of cable connection ports.

The display panel 10 may further include a screen protector 10a that is arranged on the front surface thereof to protect a panel surface. The screen protector 10a may be a transparent glass or thin film.

The housing H is a pouch-type member having a front opening (not denoted by a reference number) and an upper opening H1. As described below, since an upper end portion of the display panel 10 is inclined forward, a side surface of the housing H has a reversed triangle shape. The coupling unit including a bracket 100 is installed in the upper opening H1 so that the display device can be coupled to a lower end of an upper fixed structure in an installation place where the display device is to be installed.

Accordingly, when the housing H is coupled to the lower end of the upper fixed structure via the coupling unit such that the rear surface of the housing H is perpendicular to the lower end of the upper fixed structure, an upper portion of the display panel 10 is naturally inclined forward. Thus, a direction of the display panel 10 on which images are displayed is within a user's viewing angle.

In addition, the frame assembly according to the present invention includes: a first frame 20 with a front surface to which the display panel 10 is mounted; a second frame 30 combined with a rear surface of the first frame 20 and spaced from the rear surface of the first frame 20 by a predetermined distance; a third frame 40 and a fourth frame 50 that couple the control substrate 11 to the rear surface of the second frame 30 such that the control substrate 11 is inclined with respect to the rear surface of the second frame 30; and a fifth frame 60 combined with the rear surface of the second frame 30 and the coupling unit that is used to couple the display device to the lower end of the upper fixed structure in the installation place where the display device is to be installed.

The first frame 20 includes a body 21, a support portion 22, and a base portion 23. The body 21 has a flat panel shape and is provided with a first opening 24, which is a through hole-type opening, in a center portion thereof. The support portion 22 is a bent portion that extends rearward from respective sides of the body 21. The base portion 23 is a bent portion that extends inward from a lower end of the support portion 22.

The second frame 30 is combined with a rear surface of the base portion 23. Therefore, when the first frame 20 and the second frame 30 are combined with each other, they are spaced from each other by a distance corresponding to the width of the support portion 22 in terms of a front-and-rear direction.

Therefore, an air circulation channel is formed through the first opening 24 of the first frame 20, a second opening 31 of the second frame 30 described below, and a gap between the first frame 20 and the second frame 30. For this reason, heat generated by the display panel 10 can be dissipated.

The base portion 23 and the second frame 30 are combined by a bolt and a fixing member (for example, nut and washer (locking device)).

To this end, the base portion 23 is provided with a plurality of first insertion holes 27, into which threaded portions of bolts can be inserted, arranged in a longitudinal direction thereof. The second frame 30 has second insertion holes 37 corresponding to the first insertion holes 27.

The first insertion holes 27 of the base portion 23 are covered by the body 21. Therefore, in order to tighten or loosen the fixing member, the body 21 is provided with a plurality of tool insertion holes 25 formed to correspond to the first insertion holes 27 so that a tool can be inserted through the tool insertion holes 25 to tighten or loosen the fixing member.

The base portion 23 has a thin plate shape. Therefore, clinching nuts (not shown) are inserted in the second insertion holes 37 so that bolts can be maintained in the second insertion holes 37. In this case, the tool insertion holes 25 serve as an auxiliary air-venting means.

Reference numbers 28 and 29 denote flanges connected to and bent rearward from an upper end and a lower end of the body 21. Reference number 26 denotes a cable passage hole for a cable (not shown) by which the display panel 10 and the control substrate 11 are connected to each other.

The second frame 30 has a flat panel shape corresponding to that of the first frame 20. That is, the second frame 30 has a second opening 31, which is a through hole-type opening, in a center portion thereof such that the second opening 31 corresponds to the first opening 24 of the first frame. The second frame 30 includes flanges 32 and 33 bent forward from an upper end and a lower end of the second frame 30.

The second opening 31 communicates with the first opening 24 and a gap between the first frame 20 and the second frame 30, thereby forming an air circulation channel. For this reason, heat generated by the display panel 10 can be easily dissipated and thus the display panel 10 can be cooled down.

An upper flange 32 of the second frame 30 is exposed through the upper opening H1 of the housing H. The upper flange 32 of the second frame 30 and the fifth frame 60 described below serve as upper walls of the display device.

Reference number 34 denotes a threaded hole through which a bolt is inserted to combine the second frame 30 and the housing H with each other. Reference number 35 is a support member. The support member 35 and the base portion 23 create and maintain a gap between the first frame 20 and the second frame 30 when the first 20 and the second frame 30 are combined with each other. Reference number 36 is a cut-away hole formed by cutting away a portion of the second frame 30 to form a cable fixing portion (not denoted by any reference number) for a cable (not shown) that connects the control substrate 11 installed behind the second frame 30 to a button of a power supply provided to the side surface of the housing H.

The second frame 30 is provided with a plurality of second insertion holes 37 at respective side edge portions thereof, so that the base portion 23 of the first frame 20 and the second frame 30 can be combined with each other by screwing bolts through the first insertion holes 27 of the base portion 23 of the first frame 20 and the second insertion holes 37 of the second frame 30.

The third and fourth frames 40 and 50 couple the control substrate 11 to the second frame 30 such that an upper portion of the control substrate 11 is inclined rearward with respect to the rear surface of the second frame 30.

The third frame 40 includes: a first third-frame connection portion 41 that is in surface contact with the rear surface of the second frame 30 and combined with an upper portion of the rear surface of the second frame (the upper portion being above the second opening 31); a second third-frame connection portion 42 that is bent rearward from a lower end of the first third-frame connection portion 41 and extends rearward by a predetermined width; and a third third-frame connection portion 43 that is bent downward from a rear end portion of the second third-frame connection portion 42 and is combined with an upper end portion of the rear surface of the control substrate 11 in a surface contact manner.

The fourth frame 50 includes: a first fourth-frame connection portion 51 that is in surface contact with the rear surface of the second frame 30 and combined with a lower portion of the rear surface of the second frame 30 (the lower portion being under the second opening 31); and a second fourth-frame connection portion 52 that is in surface contact with and combined with a lower end portion of the rear surface of the control substrate 11 and is bent rearward from upper ends of respective sides of the first fourth-frame connection portion 51 at a predetermined angle corresponding to the width of the second third-frame connection portion 42 in the front-and-rear direction.

Accordingly, the third frame 40 is wider than the fourth frame 50 in the front-and-rear direction due to the second third-frame connection portion 42. Therefore, when the display device is installed such that the control substrate 11 is vertically arranged, an upper portion of the display panel 10 is inclined forward.

That is, the first fourth-frame connection portion 51 combined to be in surface contact with the rear surface of the control substrate 11 having a flat panel shape, the second fourth-frame connection portion 52 of the fourth frame 50, and the third third-frame connection portion 43 bent from the rear end of the second third-frame connection portion 42 are arranged in line with each other.

The upper portion of the control substrate 11 is inclined rearward to be spaced from the rear surface of the display panel 10.

Therefore, when the second third-frame connection portion 42 is horizontally installed via the coupling unit described below, the upper portion of the display panel 10 naturally inclines forward. Therefore, a user can see the display panel 10 from a comfortable viewing direction.

Since the gap between the first frame 20 and the second frame 30 communicates with the first and second openings 24 and 31, an air circulation path can be formed and thus heat generated by the display panel 10 can be dissipated.

In addition, due to the reversed triangle-shaped structure of the frame assembly, the display panel 10 can be spaced from the control substrate 11. Therefore, the control substrate 11 is not affected by heat generated by the display panel 10.

In this case, each combination of the first third-frame connection portion 41 and the second frame 30, the third third-frame connection portion 43 and the control substrate 11, the first fourth-frame connection portion 51 and the second frame 30, and the second fourth-frame connection portion 52 and the control substrate 11 is preferably combined by a bolt, or may alternatively be combined by other known coupling means (for example, rivet).

The second third-frame connection portion 42 is provided with a terminal exposing hole (not denoted by any reference number) through which the terminal block 12 of the control substrate 11 is exposed.

The fifth frame 60 is exposed through the upper opening H1 of the housing H. Thus, the fifth frame 60 and the upper flange 28 serve as the upper wall of the frame assembly. The fifth frame 60 includes: a first fifth-frame connection portion 61 combined with the first frame 20; and a second fifth-frame connection portion 62 bent rearward from an upper end portion of the first fifth-frame connection portion 61.

Reference number 63 denotes a connector passage hole through which connectors of various cables can be inserted to be connected to the terminal block 12 of the control substrate 11. Reference number 64 denotes a connector passage hole through which a power supply cable can be inserted to be connected to the control substrate 11.

The display device according to the present invention further includes a cap member (not shown) that is combined with an upper surface of the second third-frame connection portion 42 to protect the terminal block 12 of the control substrate 11.

The cap member is a C-shaped member that is open in the front, upper, and lower sides thereof. Flanges are provided to lower ends of respective sides of the cap member and thus the cap member can be combined with the third frame 40 by bolts.

A front portion of the terminal block 12 exposed through the terminal exposing hole of the third frame 40 is covered by the second frame 30 but respective side portions and a rear portion of the terminal block 12 are still exposed. In this case, the cap member is provided to prevent foreign matter or contaminants from adhering to an exposed portion of the terminal block 12.

Next, the coupling unit provided to the second fifth-frame connection portion 62 of the fifth frame 60 will be described with reference to FIGS. 5 and 6.

The coupling unit is an element used to couple the display device to a lower end of an upper fixed structure in an installation place in which the display device is to be installed.

The coupling unit is combined with the upper surface of the fifth frame 60 (more specifically, the upper surface of the second fifth-frame connection portion 62) by bolts. The coupling unit includes a coupling member 90 having a plurality of hooked portions 91 protruding upward, and a bracket 100 fixed to the upper fixed structure in the installation place and provided with a plurality of engagement holes 103 through which the hooked portions 91 of the coupling member 90 are inserted to be engaged with the bracket 100.

The coupling member 90 includes front and rear wall portions 94 and a side wall portion 95 arranged at first ends of the front and rear wall portions 94.

The hooked portions 91 are formed to protrude from the upper surfaces of the front and rear wall portions 94. The hooked portions 91 are arranged at regular intervals in a longitudinal direction of the front and rear wall portions 94.

In this case, since the second fifth-frame connection portion 62 of the fifth frame 60 has a thin plate shape, a bolt 65 is preferably inserted into a clinching nut (also, called pem nut) buried in the second fifth-frame connection portion 62.

The hooked portion 91 has an inclined surface 92 that is sloped down from an upper end thereof toward the upper surface of the front or rear wall portion 94. There are bay portions 93 defined by the inclined surfaces 92 of the hooked portions 91 and the upper surfaces of the front and rear wall portions 94. The bottom portion of the bracket 100 is inserted into and locked in the bay portions 93.

The hooked portions 91 may be bent such that tip portions thereof face the opposite side of the side wall portion 95, so that the coupling force between the coupling member 90 and the bracket 100 can be increased.

An innermost portion of the bay portion 93 is formed such that at least a portion of the front or rear wall portion 94 is obliquely recessed at a predetermined angle. Therefore, the bottom portion of the bracket 100 has to be forcedly fitted into the innermost portion of the bay portion 93 due to the obliquely recessed structure when the bracket 100 and the coupling member 90 are combined with each other. For this reason, the bracket 100 and the coupling member 90 are securely combined with each other.

The bracket 100 includes walls standing on a left, right, front, and rear edge of the bottom portion thereof. The bottom portion of the bracket 100 is provided with a plurality of engagement holes 103 arranged at regular intervals in a longitudinal direction thereof. The engagement holes 103 are formed so that the hooked portions 91 can be inserted through the engagement holes 103.

When installing the display device in a certain place, the hooked portions 91 of the coupling member 90 are inserted through the engagement holes 103 of the bracket 100 fixed to an upper fixed structure installed in the place. Then, the display device is pushed in the opposite direction of the side wall portion 95 of the coupling member 90, and thus the bottom portion of the bracket 100 is inserted into and locked in the bay portions. Thus, the display device can be easily coupled to the upper fixed structure in the installation place.

Conversely, when uninstalling the display device, the display device is pushed toward the side wall portion 95 of the coupling member 90 and the hooked portions 91 are pulled out through the engagement holes 103. Thus, the display device can be easily decoupled from the bracket 100 (or the upper fixed structure).

Each of the bottom portions of the coupling member 90 and the bracket 100 is provided with a connector passage hole corresponding to the connector passage hole 63 of the fifth frame 60, so that connectors of various cables can be connected to the terminal block 12 of the control substrate 11 through the connector passage hole.

The coupling unit further includes a pressing member 110 that is combined with the side wall portion 95 of the coupling member 90 and which extends through a hole formed in any one wall (herein, first wall 101a) of walls 101 of the bracket 100, which is in contact with the side wall portion 95 of the coupling member 90. The pressing member 110 puts pressing force so that the side wall portion 95 and the first wall 101a become in tighter pressure contact with each other, so that secure coupling between the hooked portions 91 and the engagement holes 103 can be maintained.

The pressing member 110 includes a knob portion 111. A user can rotate the pressing member 110 in either direction by holding and rotating the knob portion 111. According to a first embodiment of the pressing member 110, the pressing member 110 extends through a fixation hole 96 formed in the side wall portion 95 and a fitting hole 102 formed in the first wall 101a, and is fixed to a fixing member 112 (for example, nut or washer) arranged inside the first wall 101a.

When the hooked portion 91 is bent toward the opposite side of the side wall portion 95, when the pressing member 110 is tightened, the gap between the side wall portion 95 and the first wall 101a is decreased. As a result, the bottom portion of the bracket 110 is forcedly inserted into the bay portion 93 so that the coupling member 90 and the bracket 100 can be strongly combined with each other.

Conversely, when the pressing member 110 is loosened from the fixing member 112, the pressing force applied to the side wall portion 95 and the first wall 101a is eliminated and thus the coupling member 90 can be easily pulled out from the bracket 110 in a slidable manner. Therefore, the display device can be easily separated from the bracket.

At this point, since the pressing member 110 is not exposed through the upper opening H1 of the housing H, an upper portion of one side of the housing H is provided with a tool insertion hole H2 so that the pressing member 110 can be tightened or loosened by inserting a tool through the tool insertion hole H2.

Since the fixing member 112 is arranged inside the bracket 100, when the pressing member 110 is rotated in a state in which the fixing member 112 is not fixed, there is a problem that both the pressing member 110 and the fixed portion 112 are rotated together.

For this reason, a second embodiment of the pressing member 110 shown in FIG. 7 may be used. With the use of the pressing member 110 according to the second embodiment, the coupling member 90 and the bracket 100 can be easily assembled with and disassembled from each other.

Specifically, the pressing member 110 may include a core member 110. The core member 110 has a hollow space that extends in a longitudinal direction thereof.

The core member 110 also has a plurality of wing portions 115 inserted in the hollow space, combined with an inner end portion of the hollow space by a hinge, and elastically supported to be folded outward.

The pressing member 110 further includes a coil spring 116 that presses the core member 113 outward. At this point, the wing portions 115 push the first wall 101a of the bracket 100 outward.

At an outer end portion of the core member 113 is provided with a pressing portion 114 that is combined with the pressing member 110. The pressing portion 114 can be driven to be expelled from and retreated into the hollow space.

The wing portion 115 is a latch-type member that can be rotated only in one direction. The hinge 115a that connects the wing portions 115 to the inner end portion of the hollow of the core member 113 is provided with an elastic member (not shown) that applies elastic force such that the wing portions 115 can be folded outward.

Since the wing portions 115 are forcedly folded outward by the elastic member, when the core member 113 is pushed to be expelled from the hollow by the coil spring 116, the wing portions 115 spread and thus press the first wall 101a of the bracket 100 toward the side wall portion 95 of the coupling member 90. Therefore, the hooked portions 91 and the engagement holes 103 can be securely engaged with each other.

Conversely, when the pressing portion 114 is pressed inward so that the core member 113 can be retreated into the hollow space, the contact pressure between the wing portions 115 and the first wall 101a is removed. Thus, the wing portions 115 are folded outward by the elastic force of the elastic member. At this point, when a user holds the knob portion 111 of the pressing member 110 and pulls the pressing member 110 outward, the wing portions 115 are separated while passing through the fitting hole 102 and the fixation hole 96. Therefore, the pressing force applied to the first wall 101a and the side wall portion 95 is removed, and thus the coupling member 90 and the bracket 100 can be easily separated from each other.

Although a display device with specific structures and functions has been described with reference to the accompanying drawings, for illustrative purposes, those skilled in the art will appreciate that various modifications, additions and substitutions are possible, without departing from the scope and spirit of the invention as disclosed in the accompanying claims.

What is claimed is:

1. A display device equipped with a frame assembly, the display device comprising a display panel and a frame assembly, the frame assembly including:
    a first frame including a body provided with a first through-hole opening in a center portion thereof and a front surface with which the display panel is combined, support portions bent and extending rearward from respective sides of
    the body, and base portions bent and extending inward from ends of the support portions;
    a second frame combined with a rear surface of the base portion and provided with a second through-hole opening in a center portion thereof;
    a third frame that is combined with an upper portion of a rear surface of the second frame, the upper portion being above the second through-hole opening, and an upper end portion of a control substrate connected to the display panel being combined with the third frame; and a fourth frame that is combined with a lower portion of the rear surface of the second frame, the lower portion being under the second through-hole opening, and a lower end portion of the control substrate being combined with the fourth frame, wherein the third frame has a width larger than that of the fourth frame in a front-and-rear direction, so that an upper end portion of the display panel is inclined forward when the display device is installed such that the control substrate is vertically arranged.

2. The display device according to claim 1, wherein the frame assembly further includes a fifth frame that is combined with an upper portion of the rear surface of the second frame, the upper portion being above the second through-hole opening, and with which a coupling unit for coupling the display device to a lower end of an upper fixed structure is combined.

3. The display device according to claim 2, wherein the coupling unit includes:

a coupling member combined with an upper surface of the fifth frame and provided with a plurality of hooked portions protruding from an upper surface of a wall portion thereof; and a bracket that is fixed to a lower end of the upper fixed structure in an installation place in which the display device is to be installed and which is provided with a plurality of engagement holes through which the hooked portions are inserted to be engaged with the bracket.

4. The display device according to claim 1, wherein the third frame includes: a first third-frame connection portion that is in surface contact with the rear surface of the second frame and combined with an upper portion of the rear surface of the second frame; a second third-frame connection portion bent from a lower end of the first third-frame connection portion and extending rearward by a predetermined width; and a third third-frame connection portion that is bent downward from a rear end of the second third-frame connection portion and is in surface contact with an upper end portion of a rear surface of the control substrate, and wherein the fourth frame includes: a first fourth-frame connection portion that is in surface contact with the rear surface of the second frame and combined with a lower portion of the rear surface of the second frame; and a second fourth-frame connection portion that is in surface contact with a lower end portion of the rear surface of the control substrate and is bent rearward from upper ends of respective sides of the first fourth-frame connection portion at a predetermined angle corresponding to a width of the second third-frame connection portion in a front-and-rear direction.

5. The display device according to claim 2, wherein the third frame includes: a first third-frame connection portion that is in surface contact with the rear surface of the second frame and combined with an upper portion of the rear surface of the second frame; a second third-frame connection portion bent from a lower end of the first third-frame connection portion and extending rearward by a predetermined width; and a third third-frame connection portion that is bent downward from a rear end of the second third-frame connection portion and is in surface contact with an upper end portion of a rear surface of the control substrate, and wherein the fourth frame includes: a first fourth-frame connection portion that is in surface contact with the rear surface of the second frame and combined with a lower portion of the rear surface of the second frame; and a second fourth-frame connection portion that is in surface contact with a lower end portion of the rear surface of the control substrate and is bent rearward from upper ends of respective sides of the first fourth-frame connection portion at a predetermined angle corresponding to a width of the second third-frame connection portion in a front-and-rear direction.

6. The display device according to claim 3, wherein the third frame includes: a first third-frame connection portion that is in surface contact with the rear surface of the second frame and combined with an upper portion of the rear surface of the second frame; a second third-frame connection portion bent from a lower end of the first third-frame connection portion and extending rearward by a predetermined width; and a third third-frame connection portion that is bent downward from a rear end of the second third-frame connection portion and is in surface contact with an upper end portion of a rear surface of the control substrate, and wherein the fourth frame includes: a first fourth-frame connection portion that is in surface contact with the rear surface of the second frame and combined with a lower portion of the rear surface of the second frame; and a second fourth-frame connection portion that is in surface contact with a lower end portion of the rear surface of the control substrate and is bent rearward from upper ends of respective sides of the first fourth-frame connection portion at a predetermined angle corresponding to a width of the second third-frame connection portion in a front-and-rear direction.

* * * * *